(12) United States Patent  (10) Patent No.: US 12,176,676 B2
Chiu  (45) Date of Patent: Dec. 24, 2024

(54) PACKAGE DESIGNS TO ENABLE DUAL-SIDED COOLING ON A LASER CHIP

(71) Applicant: Intel Corporation, Santa Clara, CA (US)

(72) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 872 days.

(21) Appl. No.: 17/076,443

(22) Filed: Oct. 21, 2020

(65) Prior Publication Data

US 2022/0123521 A1   Apr. 21, 2022

(51) Int. Cl.
*H01S 3/04* (2006.01)
*H01S 5/023* (2021.01)
*H01S 5/024* (2006.01)
*H01S 5/042* (2006.01)

(52) U.S. Cl.
CPC .......... *H01S 5/02476* (2013.01); *H01S 5/023* (2021.01); *H01S 5/02415* (2013.01); *H01S 5/02423* (2013.01); *H01S 5/02461* (2013.01); *H01S 5/02469* (2013.01); *H01S 5/04256* (2019.08)

(58) Field of Classification Search
CPC .. H01S 5/02476; H01S 5/023; H01S 5/02415; H01S 5/02423; H01S 5/02461; H01S 5/02469; H01S 5/04256
See application file for complete search history.

(56) References Cited

U.S. PATENT DOCUMENTS

| | | | |
|---|---|---|---|
| 6,829,264 B2* | 12/2004 | Deacon | H01S 5/024 372/36 |
| 7,779,638 B2* | 8/2010 | Sauciuc | H01L 23/38 62/3.2 |
| 10,732,265 B1 | 8/2020 | Parameswaran et al. | |
| 2003/0107114 A1* | 6/2003 | Lam | H01S 5/02415 257/675 |
| 2005/0139991 A1* | 6/2005 | White | H01L 24/31 257/E23.09 |
| 2005/0141575 A1 | 6/2005 | Lorenzen | |
| 2009/0092162 A1* | 4/2009 | Huff | H01S 5/024 372/50.12 |
| 2015/0023376 A1 | 1/2015 | Yamanaka et al. | |

(Continued)

OTHER PUBLICATIONS

Extended European Search Report for European Patent Application No. 21187340.1 mailed Feb. 10, 2022, 9 pgs.

(Continued)

*Primary Examiner* — Kinam Park (74) *Attorney, Agent, or Firm* — Schwabe, Williamson & Wyatt P.C.

(57) ABSTRACT

Embodiments disclosed herein include dual sided cooling architectures for laser packages. In an embodiment, an electronic package comprises a package substrate, and a laser chip attached to the package substrate. In an embodiment, the laser chip has a first surface and a second surface opposite from the first surface. In an embodiment, an interposer is disposed over the laser chip, where the interposer overhangs an edge of the laser chip. In an embodiment, the electronic package further comprises an interconnect between the interposer and the package substrate.

25 Claims, 8 Drawing Sheets

(56) References Cited

U.S. PATENT DOCUMENTS

| | | | |
|---|---|---|---|
| 2016/0126695 A1* | 5/2016 | Gambino | H01L 24/13 |
| | | | 438/26 |
| 2016/0204575 A1* | 7/2016 | Horn | H01S 5/0237 |
| | | | 372/36 |
| 2017/0051884 A1* | 2/2017 | Raring | H01S 5/22 |
| 2017/0092561 A1* | 3/2017 | Eid | H01L 21/4878 |
| 2018/0005991 A1* | 1/2018 | Seidemann | H01L 24/96 |
| 2018/0138146 A1* | 5/2018 | Cheah | H01L 24/33 |
| 2019/0006549 A1* | 1/2019 | Yim | H01L 23/49827 |

OTHER PUBLICATIONS

Notice of Allowance for European Patent Application No. 21187340.1 mailed Jan. 5, 2024, 8 pgs.

* cited by examiner

PACKAGE DESIGNS TO ENABLE DUAL-SIDED COOLING ON A LASER CHIP

TECHNICAL FIELD

Embodiments of the present disclosure relate to semiconductor devices, and more particularly to electronic packages for laser chips that enable dual sided cooling of the laser chip.

BACKGROUND

The use of laser based optical communications in electronic packaging is increasing as electronic devices move towards faster communication speeds. In such optical systems, one important design consideration is the ability to adequately cool the laser chip. Thermal control of the laser chip is necessary because the lasers must operate in a low temperature range in order to function properly and efficiently.

Currently, the cooling of the laser chip is implemented by a single sided cooling architecture. Only a single side of the laser chip may be actively cooled because the top surface of the laser chip includes wire bonds that attach to the package substrate. The wire bonds occupy area on the top surface of the laser chip. Therefore, there is no room to place a substrate that can be coupled to a cooling solution.

Since only a single side of the laser chip can be cooled, the cooling solution must be a low thermal resistance cooling solution. For example, the cooling solution may be a thermoelectric cooling (TEC) device, a liquid cooled device, or a combination of a TEC and liquid cooling. Such cooling solutions are more expensive than traditional air cooled heatsinks and increase the complexity of the device.

2

EMBODIMENTS OF THE PRESENT DISCLOSURE

Described herein are electronic packages for laser chips that enable dual sided cooling of the laser chip, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
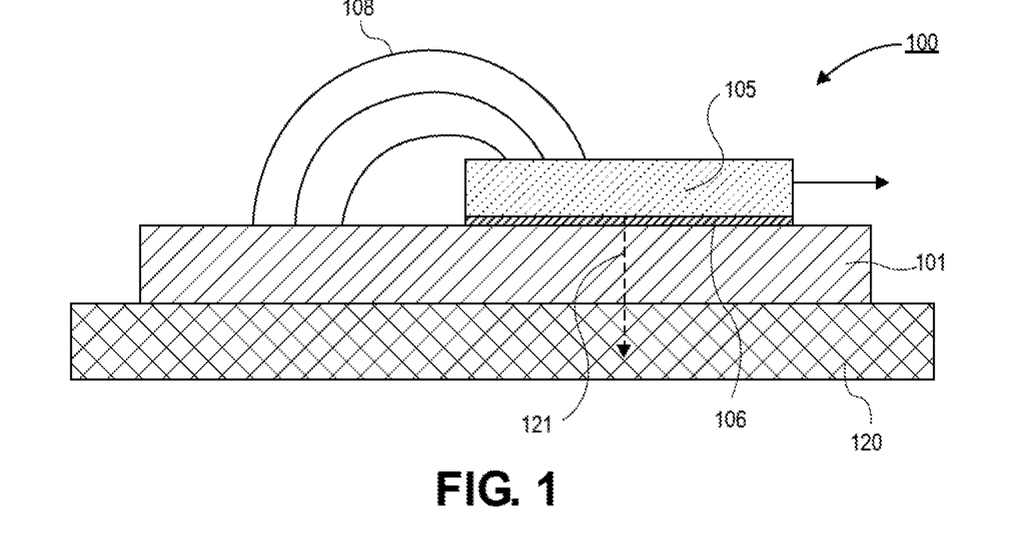
FIG. 1 is a cross-sectional illustration of an electronic device with a laser chip and a single sided cooling solution, in accordance with an embodiment.

As noted above, thermal control of a laser chip is currently only capable of being provided over a single surface of the laser chip. An example of a typical laser chip package 100 is shown in FIG. 1. As shown, the laser chip 105 is attached to a package substrate 101 by a solder 106 or electrically conductive epoxy. The solder 106 provides a cathode connection (i.e., ground) to the laser chip 105. The anode connection (i.e., power) is provided to the laser chip 105 through wire bonds 108. The wire bonds 108 connect to a top surface of the package substrate 101 and a top surface of the laser chip 105. As shown, the laser emits light as indicated by the arrow extending away from a side of the laser chip 105. In the illustrated embodiment, the laser light is emitted proximate to a top surface of the laser chip 105 opposite from the solder 106.

In an embodiment, the laser chip is cooled through the use of a cooling solution 120. As shown by the dashed arrow 121, thermal energy is pulled from a bottom surface of the laser chip 105 towards the cooling solution 120. It is to be appreciated that cooling the top surface of the laser chip 105 is not possible since the wire bonds 108 extend up from the top surface of the laser chip 105. Since only a single cooling solution 120 is provided, the cooling solution 120 must be a high performance cooling solution in order to adequately cool the laser chip 105. For example, the cooling solution 120 may be a liquid cooled device, a thermoelectric cooling (TEC) device, or a combination of the two different types of devices. Such advanced cooling solutions increase the complexity and cost of the laser chip package 100.

Accordingly, embodiments disclosed herein include a laser chip package that enables dual sided cooling. That is, a cooling solution is thermally coupled to both the bottom surface of the laser chip and the top surface of the laser chip. As such, thermal control of the laser chip is improved. Additionally, the added cooling solution allows for less complex cooling solutions to be used to provide the necessary cooling of the laser chip. For example, the dual sided cooling solutions may comprise air cooled heatsinks, which are less complex and less expensive than liquid cooling and/or TEC solutions.

In an embodiment, the dual sided cooling is enabled by the replacement of the wire bonds with a thermally conductive interposer. The interposer overhangs the laser chip. This allows for connections from the laser chip to the interposer to be provided, while also providing a location (i.e., the overhang region) where a vertical connection to the package substrate is made. In this manner, a connection to the top surface of the laser chip can be provided through the interposer. Since the interposer is formed with a thermally conductive material, suitable thermal coupling between the top surface of the laser chip and a second cooling solution can be provided. In some embodiments, the laser chip is oriented so that the cathode connection is provided on the bottom surface of the laser chip (i.e., facing the package substrate). In other embodiments, the laser chip is oriented so that the cathode connection is provided on the top surface of the laser chip (i.e., facing away from the package substrate).

Figure 2A:
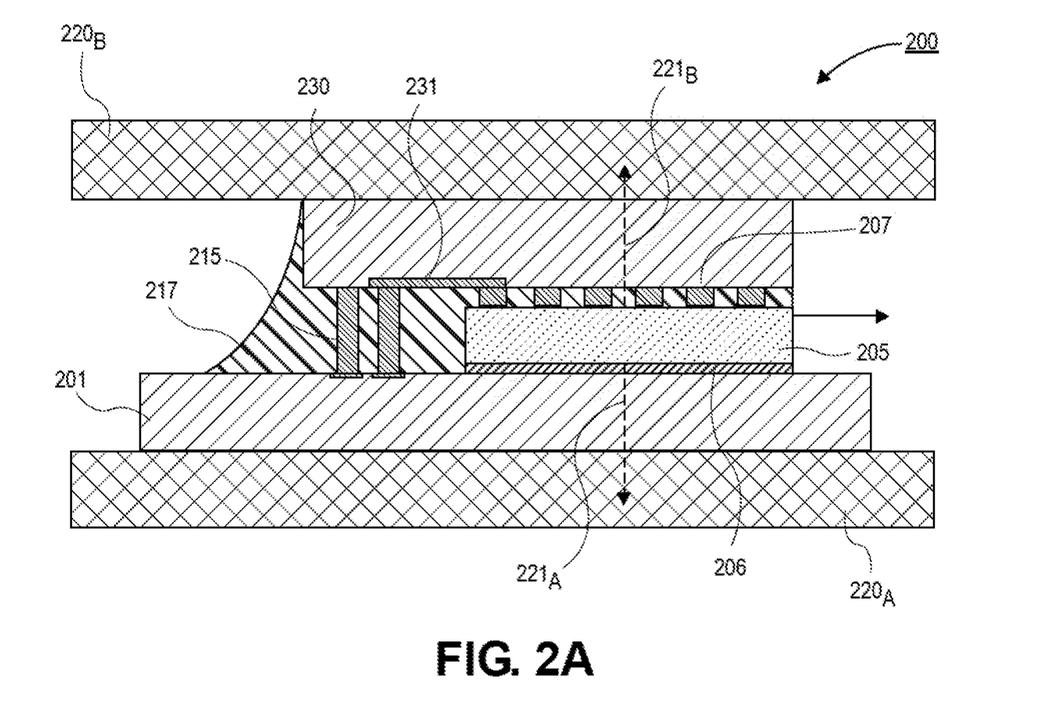
FIG. 2A is a cross-sectional illustration of an electronic device with a laser chip and a dual sided cooling solution, in accordance with an embodiment.

Referring now to FIG. 2A, a cross-sectional illustration of a laser chip package 200 is shown, in accordance with an embodiment. In an embodiment, the laser chip package 200 may comprise a package substrate 201 and a laser chip 205 attached to the package substrate 201. In an embodiment, the package substrate 201 may be a thermally conductive material. That is, in some embodiments, the package substrate 201 may not be a traditional organic package substrate. Instead, the package substrate 201 may comprise thermally conductive materials, such as, but not limited to, AlN, SiC, or Si. In an embodiment, the laser chip 205 may be fabricated on any suitable semiconductor substrate. The laser chip 205 may emit a laser beam out a side surface of the laser chip 205, as indicated by the arrow.

In an embodiment, the laser chip 205 may be electrically coupled to the package substrate 201 by a solder 206 or an electrically conductive epoxy. The solder 206 may provide a cathode connection to the laser chip 205. That is, the solder 206 may be the path to ground for the laser chip 205. The solder 206 may be electrically coupled to conductive wiring, pads, or planes in the package substrate 201.

In an embodiment, the top surface of the laser chip 205 is electrically coupled to an interposer 230. The interposer 230 may be a thermally conductive material, such as, but not limited to, AlN, SiC, or Si. The interposer 230 may have a coefficient of thermal expansion (CTE) that is substantially similar to the CTE of the laser chip 205 in some embodiments. In a particular embodiment, the interposer 230 may comprise the same material as the laser chip 205. The interposer 230 may overhang the laser chip 205. That is, the interposer 230 may extend past an edge of the laser chip 205. Overhanging the interposer 230 over the laser chip 205 provides a path from the interposer 230 to the package substrate 201 outside of the laser chip 205, as will be described in greater detail below.

The laser chip 205 may be electrically coupled to the interposer 230 by bumps 207. The bumps 207 may be copper bumps or the like. In an embodiment, the bumps 207 may be formed on the laser chip 205 and adhered to the interposer 230. In other embodiments, the bumps 207 may be formed on the interposer 230 and adhered to the laser chip 205. In such an embodiment, there may not need to be any modification to the laser chip 205. That is, the laser chip 205 may be an "off the shelf" laser chip 205. As such, costs are reduced since additional manufacturing is not needed for the laser chip 205.

In an embodiment, the bumps 207 may be electrically coupled to conductive traces 231 on (or embedded in) the interposer 230. The conductive traces 231 extend from the bumps 207 toward an edge of the interposer 230. That is, the conductive traces 231 extend to the overhanging region of the interposer 230. In an embodiment, the conductive traces 231 may be electrically coupled to an interconnect 215. The interconnect 215 may provide an electrical connection between the interposer 230 and the package substrate 201. In an embodiment, the interconnect 215 may be a conductive pillar, such as a copper pillar. However, it is to be appreciated that other interconnect architectures (e.g., solder balls, interposers, etc.) may be used to form the interconnect 215. In an embodiment, the electrical path from the interposer 230, to the interconnects 215, to the conductive traces 231, and to the bumps 207 may provide an anode connection to the laser chip 205. For example, the anode connection may provide power to the laser chip 205.

In an embodiment, an underfill 217 may be provided between the interposer 230 and the package substrate 201. The underfill 217 may surround the interconnects 215. In an embodiment, the underfill 217 may also surround the bumps 207. That is, the underfill 217 may also be present between the interposer 230 and the laser chip 205 in some embodiments. The underfill 217 may be any suitable electrically insulating material known in the art, such as an epoxy or the like.

In an embodiment, a first cooling solution $220_A$ is provided over a surface of the package substrate 201 facing away from the laser chip 205. Additionally, a second cooling solution $220_B$ is provided over a surface of the interposer 230 facing away from the laser chip 205. As such, a first cooling path $221_A$ is provided away from a bottom surface of the laser chip 205, and a second cooling path $221_B$ is provided away from a top surface of the laser chip 205. That is, the laser chip 205 may have a dual sided cooling solution.

In an embodiment, the first cooling solution $220_A$ and the second cooling solution $220_B$ may be substantially similar to each other. In other embodiments, the first cooling solution $220_A$ may be different than the second cooling solution $220_B$. Since a dual sided cooling solution is provided, the efficiency of the cooling solutions $220_A$ and $220_B$ may be lower than the efficiency needed when a single sided cooling solution (e.g., similar to FIG. 1) is used. As such, the first cooling solution $220_A$ and the second cooling solution $220_B$ may comprise air cooled heatsinks. For example, the first cooling solution $220_A$ and the second cooling solution $220_B$ may comprise fins (not shown) that are cooled with air through convection. However, it is to be appreciated that the first cooling solution $220_A$ and the second cooling solution $220_B$ may comprise any type of cooling solution, such as, but not limited to, liquid cooled solutions, TEC solutions, vapor chambers, and the like.

Figure 2B:
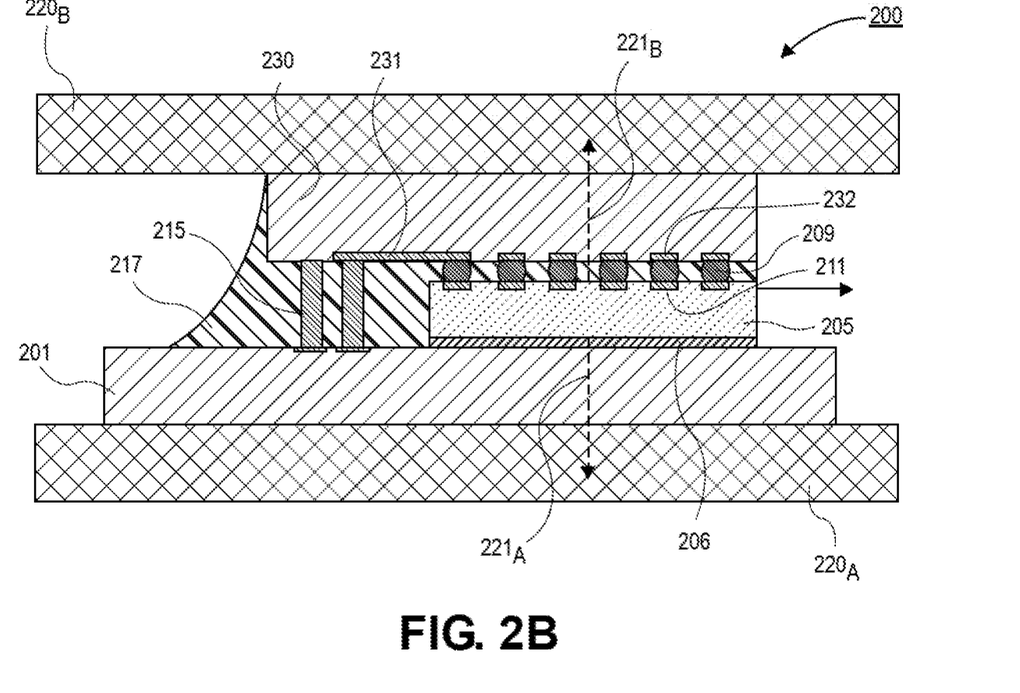
FIG. 2B is a cross-sectional illustration of an electronic device with a laser chip and a dual sided cooling solution, in accordance with an additional embodiment.

Referring now to FIG. 2B, a cross-sectional illustration of a laser package 200 is shown, in accordance with an additional embodiment. In an embodiment, the laser package 200 in FIG. 2B may be substantially similar to the laser package 200 in FIG. 2A, with the exception that the interconnect between the interposer 230 and the laser chip 205 is altered. As shown in FIG. 2B, the bumps 207 are replaced with solder 209. In an embodiment, the solder 209 may be provided between pads 211 on the laser chip 205 and pads 232 on the interposer 230. In such an embodiment, the pads 211 on the laser chip 205 may be the same pads that would otherwise be used for wire bonding if a wire bonding architecture were used. As such, there is no need to modify existing laser chips 205, and cost and complexity is reduced.

The pads 232 on the interposer 230 may be electrically connected to conductive traces 231, and the conductive traces 231 are electrically connected to the interconnects 215. As such, a conductive path from the top surface of the laser chip 205 to the package substrate 201 is provided outside of the laser chip 205. Additionally, since there are no wire bonds occupying the top surface of the laser chip 205, the interposer 230 and the second cooling solution $220_B$ may provide thermal control of the laser chip 205. As such, dual sided thermal control of the laser chip 205 is provided.

Referring now to FIGS. 3A-3E, a series of cross-sectional illustrations depicting a process for assembling a laser package is shown, in accordance with an embodiment. In FIGS. 3A-3E a laser package with an architecture similar to the architecture in FIG. 2A is shown. However, it is to be appreciated that substantially similar processing operations may be used to form a laser package similar to the architecture shown in FIG. 2B. Particularly, solder balls would replace the bumps 307 in such an embodiment.

Figure 3A:
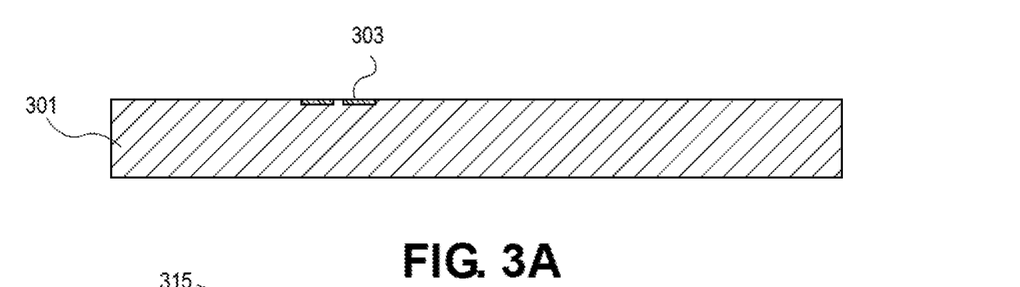
FIG. 3A is a cross-sectional illustration of an electronic device with a package substrate, in accordance with an embodiment.

Referring now to FIG. 3A, a cross-sectional illustration of a package substrate 301 is shown, in accordance with an embodiment. In an embodiment, the package substrate 301 may comprise a thermally conductive package substrate. For example, the package substrate 301 may comprise AlN, SiC, or Si. In an embodiment, conductive routing (not shown) may be provided in the package substrate 301. As shown in FIG. 3A, pads 303 may be provided on the package substrate 301. The pads 303 may be at locations where interconnects to the interposer are formed.

Figure 3B:
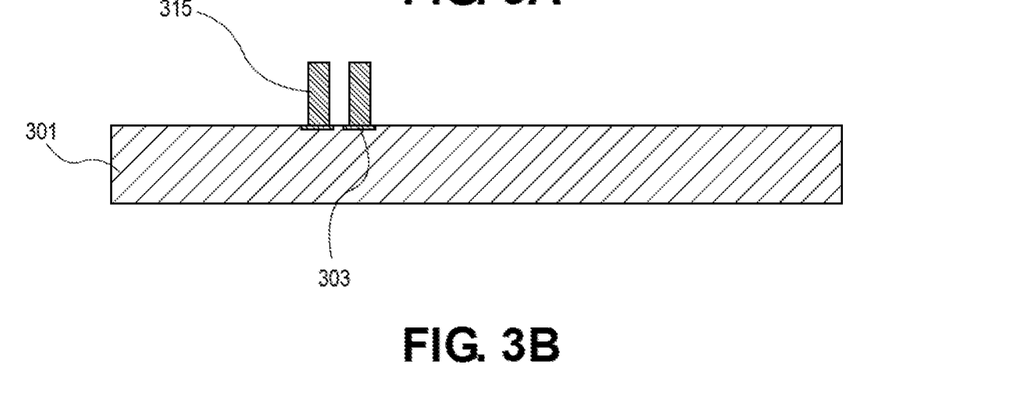
FIG. 3B is a cross-sectional illustration of the electronic device after conductive pillars are formed over the package substrate, in accordance with an embodiment.

Referring now to FIG. 3B, a cross-sectional illustration of the package substrate 301 after interconnects 315 are formed over the pads 303 is shown, in accordance with an embodiment. In an embodiment, the interconnects 315 may comprise copper pillars. However, it is to be appreciated that other interconnect architectures may be used, such as, but not limited to, solder balls, interposers, or the like. In an embodiment, the interconnects 315 may comprise a height that is greater than the thickness of the laser chip that will be attached to the package substrate 301 in a subsequent processing operation.

Figure 3C:
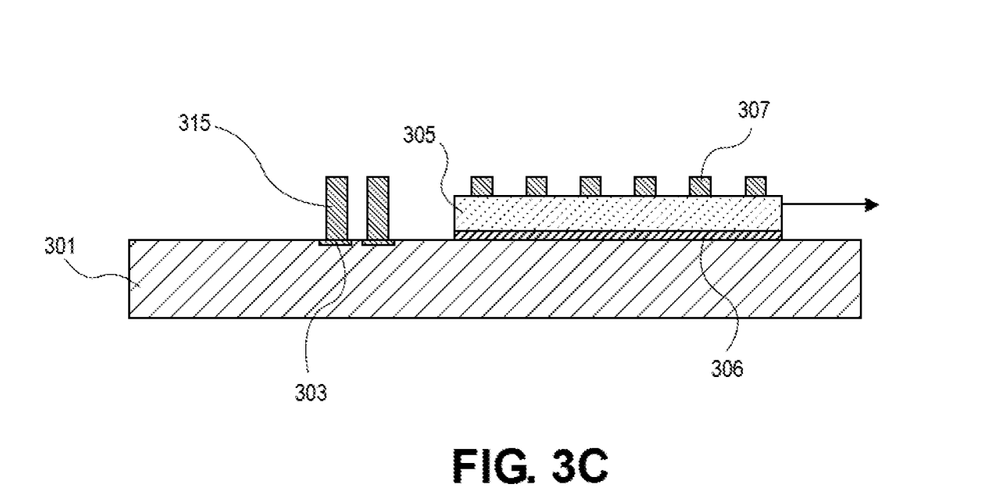
FIG. 3C is a cross-sectional illustration of the electronic device after a laser chip is attached to the package substrate, in accordance with an embodiment.

Referring now to FIG. 3C, a cross-sectional illustration of the package substrate 301 after a laser chip 305 is attached is shown, in accordance with an embodiment. In an embodiment, the laser chip 305 may be attached to the package substrate 301 with a solder 306 or an electrically conductive epoxy. The solder 306 may provide a cathode (i.e., ground) connection to the laser chip 305. In an embodiment, the laser chip 305 may be oriented so that the emitted laser light (indicated by the arrow) is closer to the top surface of the laser chip 305 than the bottom surface of the laser chip 305.

In an embodiment, conductive bumps 307 may be disposed on the top surface of the laser chip 305. However, in other embodiments, the conductive bumps 307 may be provided on the subsequently attached interposer instead of being formed on the laser chip 305.

Figure 3D:
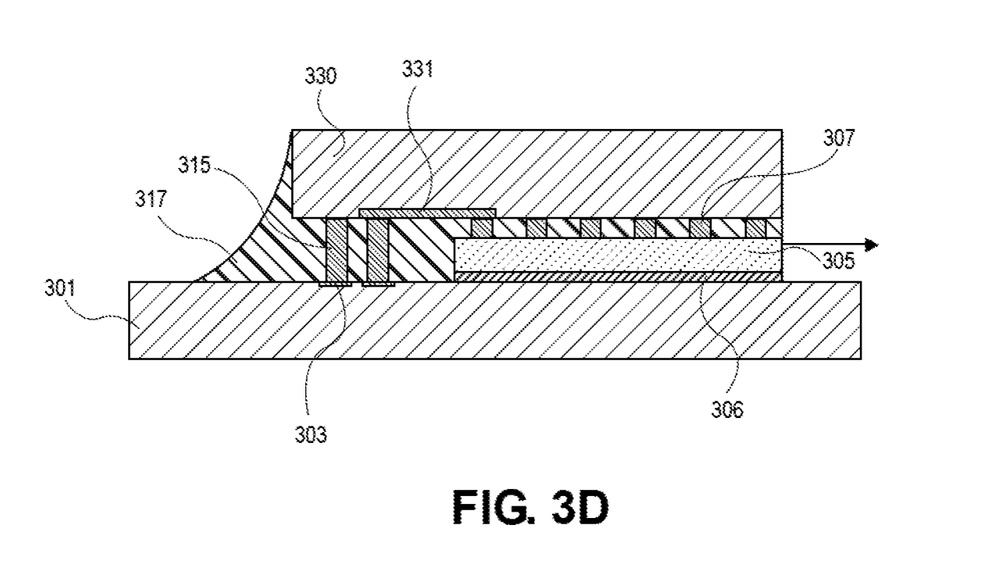
FIG. 3D is a cross-sectional illustration of the electronic device after an interposer is attached to the laser chip, in accordance with an embodiment.

Referring now to FIG. 3D, a cross-sectional illustration of the package substrate 301 after an interposer 330 is attached to the laser chip 305 is shown, in accordance with an embodiment. In an embodiment, the interposer 330 may be a thermally conductive material, such as, but not limited to AlN, SiC, or Si. The interposer 330 may comprise conductive traces 331 to electrically couple the bumps 307 to the interconnects 315. As such, a conductive path for an anode (i.e., power) is provided to the top surface of the laser chip 305 through a path entirely outside of the laser chip 305. After the interposer 330 is attached, an underfill 317 may be dispensed between the interposer 330 and the package substrate 301 and between the interposer 330 and the top surface of the laser chip 305.

Figure 3E:
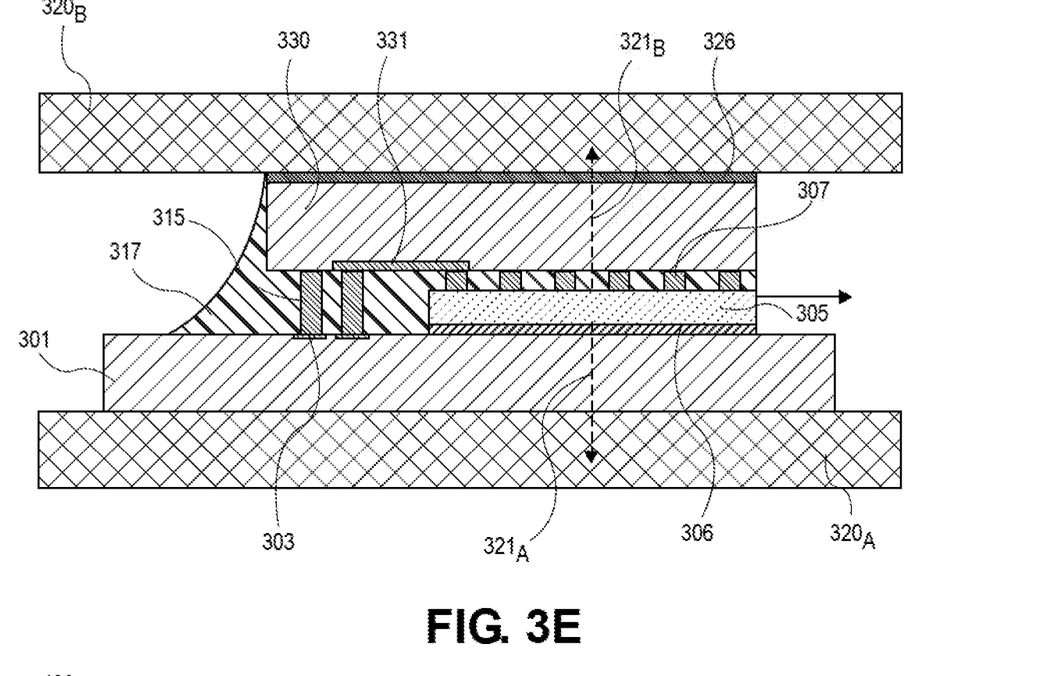
FIG. 3E is a cross-sectional illustration of the electronic device after cooling solutions are provided over the package substrate and the interposer, in accordance with an embodiment.

Referring now to FIG. 3E, a cross-sectional illustration of the package substrate 301 after a first cooling solution $320_A$ and a second cooling solution $320_B$ are attached is shown, in accordance with an embodiment. In an embodiment, the first cooling solution $320_A$ is thermally coupled to the package substrate 301. For example, a thermal interface material (TIM) 326 may be provided between the first cooling solution $320_A$ and the package substrate 301. In an embodiment, the second cooling solution $320_B$ is thermally coupled to the interposer 330. For example, a TIM 326 may be provided between the second cooling solution $320_B$ and the interposer 330. The first cooling solution $320_A$ provides a cooling path $321_A$ from the bottom surface of the laser chip 305, and the second cooling solution $320_B$ provides a cooling path $321_B$ from the top surface of the laser chip 305.

In an embodiment, the first cooling solution $320_A$ and the second cooling solution $320_B$ may be substantially similar to each other. In other embodiments, the first cooling solution $320_A$ may be different than the second cooling solution $320_B$. Since a dual sided cooling solution is provided, the efficiency of the cooling solutions $320_A$ and $320_B$ may be lower than the efficiency needed when a single sided cooling solution (e.g., similar to FIG. 1) is used. As such, the first cooling solution $320_A$ and the second cooling solution $320_B$ may comprise air cooled heatsinks. For example, the first cooling solution $320_A$ and the second cooling solution $320_B$ may comprise fins (not shown) that are cooled with air through convection. However, it is to be appreciated that the first cooling solution $320_A$ and the second cooling solution $320_B$ may comprise any type of cooling solution, such as, but not limited to, liquid cooled solutions, TEC solutions, vapor chambers, and the like.

Figure 4:
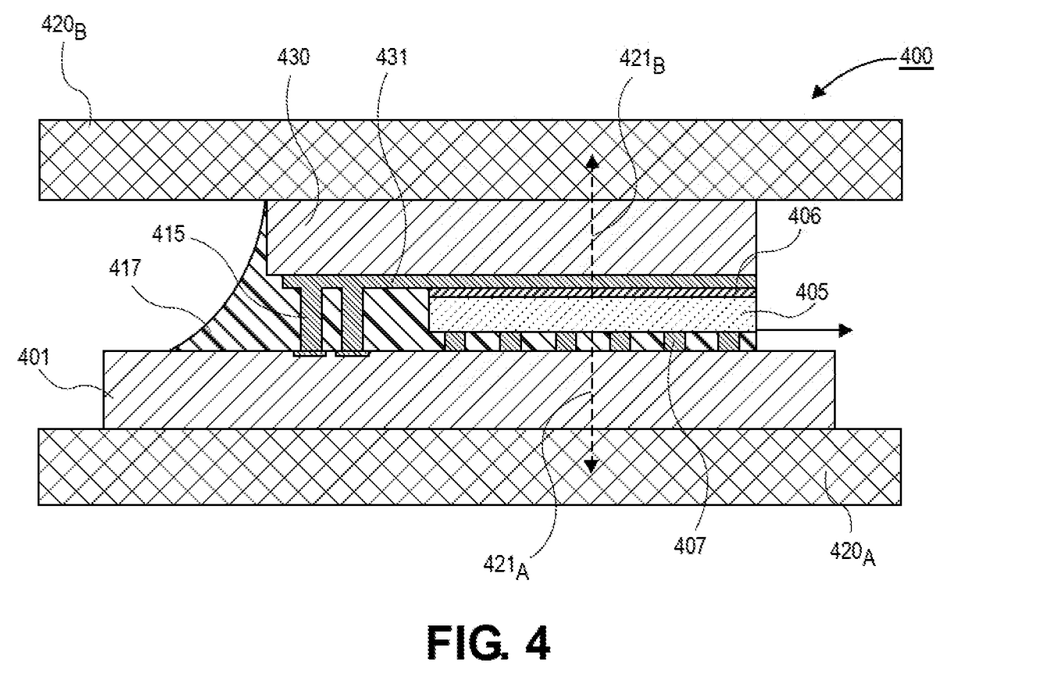
FIG. 4 is a cross-sectional illustration of an electronic device with a laser chip that is provided between a package substrate and an interposer, in accordance with an embodiment.

Referring now to FIG. 4, a cross-sectional illustration of a laser package 400 is shown, in accordance with an additional embodiment. The laser package 400 in FIG. 4 is substantially similar to the laser package 200 in FIG. 2A, with the exception of the orientation of the laser chip 405. Particularly, the laser chip 405 is flipped upside down compared to the laser chip 205 in FIG. 2A. As such, the laser light (indicated by the arrow) is transmitted out a side of the laser chip 405 closer to the bottom surface of the laser chip 405. Similar to the laser package 200 in FIG. 2A, the laser package 400 comprises a package substrate 401 and an interposer 430. A first cooling solution $420_A$ is thermally coupled to the package substrate 401, and a second cooling solution $420_B$ is thermally coupled to the interposer 430. As such, a first cooling path $421_A$ is provided from a bottom surface of the laser chip 405, and a second cooling path 421$_B$ is provided from a top surface of the laser chip 405.

Flipping the laser chip 405 also results in the anode connection and the cathode connection switching places. The anode connection (i.e., power) is made to the bottom surface of the laser chip 405 through bumps 407. While bump 407 are shown in FIG. 4, it is to be appreciated that the bumps 407 may be replaced with solder balls between pads, similar to the embodiment shown in FIG. 2B. The cathode connection (i.e., ground) is made to the top surface of the laser chip 405 through a solder 406 or electrically conductive epoxy. The cathode path may continue across the interposer 430 by a conductive trace 431 to the interconnects 415 which provide electrical coupling back to the package substrate 401. An underfill 417 may surround the interconnects 415 and the bumps 407.

Referring now to FIGS. 5A-5D, a series of cross-sectional illustrations depicting a process for forming a laser package similar to the laser package 400 in FIG. 4 is shown, in accordance with an embodiment.

Figure 5A:
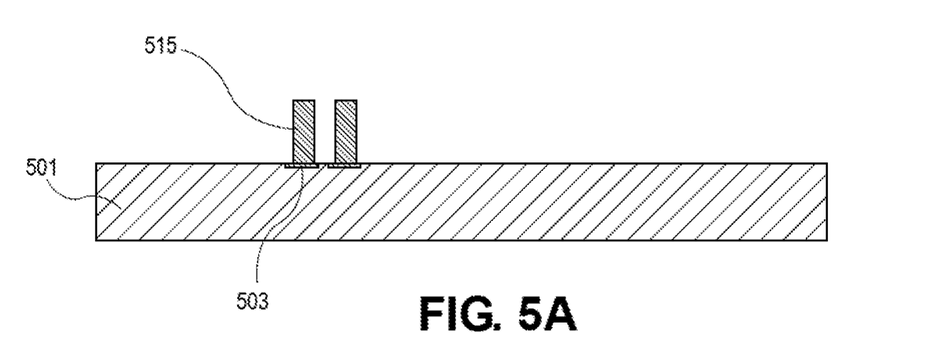
FIG. 5A is a cross-sectional illustration of an electronic device with conductive pillars over a package substrate, in accordance with an embodiment.

Referring now to FIG. 5A, a cross-sectional illustration of a package substrate 501 is shown, in accordance with an embodiment. In an embodiment, the package substrate 501 may comprise a thermally conductive material, such as, but not limited to, AlN, SiC, or Si. In an embodiment, the package substrate 501 may comprise pads 503. Interconnects 515 may be formed over the pads 503. In a particular embodiment, the interconnects 515 comprise conductive pillars (e.g., copper pillars). However, it is to be appreciated that any interconnect architecture may be used, such as solder balls, an interposer, or the like. The height of the interconnects 515 may be taller than a thickness of the laser chip attached in a subsequent processing operation.

Figure 5B:
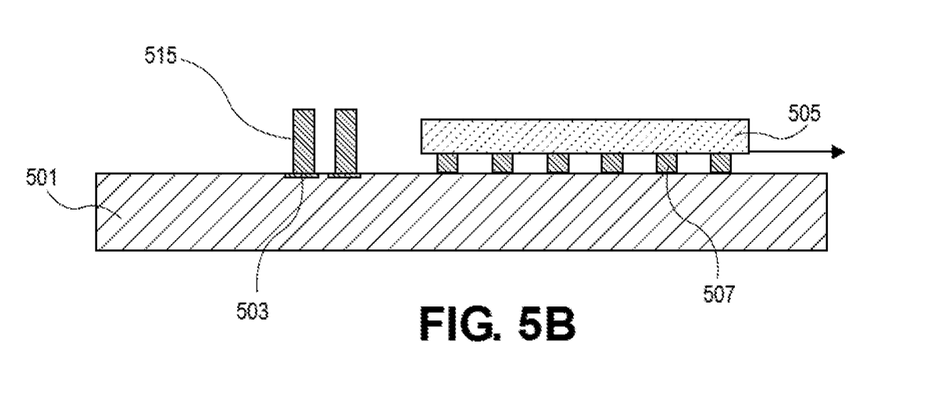
FIG. 5B is a cross-sectional illustration of the electronic device after a laser chip is attached to the package substrate, in accordance with an embodiment.

Referring now to FIG. 5B, a cross-sectional illustration of the package substrate 501 after a laser chip 505 is attached is shown, in accordance with an embodiment. In an embodiment, the laser chip 505 is attached to the package substrate 501 by bumps 507. However, it is to be appreciated that the bumps 507 may be replaced with solder balls in some embodiments. In an embodiment, the bumps 507 are formed on the laser chip 505 and attached to the package substrate 501. In other embodiments, the bumps 507 may be formed on the package substrate 501 and attached to the laser chip 505.

In an embodiment, the laser chip 505 is oriented so that the anode connection (i.e., power) is provided through the bottom surface of the laser chip 505. In an embodiment, the light emitted from the laser chip 505 (as indicated by the arrow) may be closer to the bottom surface of the laser chip 505 than the top surface of the laser chip 505.

Figure 5C:
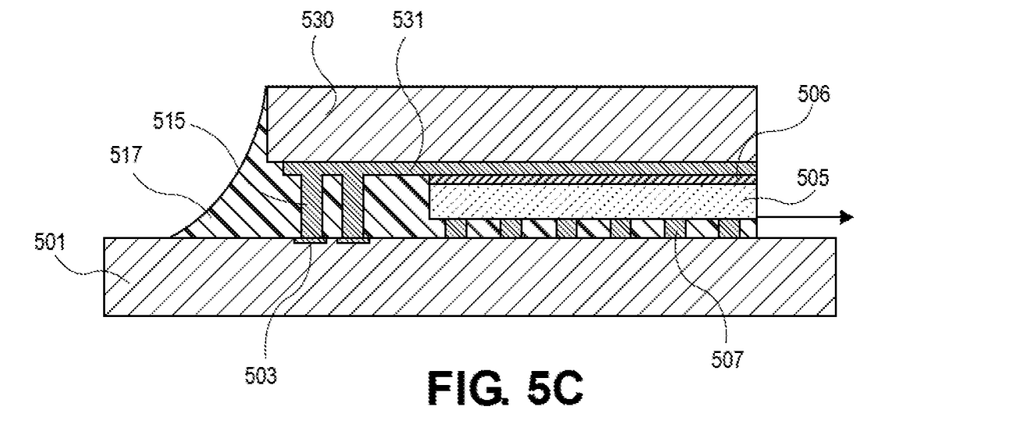
FIG. 5C is a cross-sectional illustration of the electronic device after an interposer is attached over the laser chip, in accordance with an embodiment.

Referring now to FIG. 5C, a cross-sectional illustration of the package substrate 501 after an interposer 530 is attached is shown, in accordance with an embodiment. In an embodiment, the interposer 530 is attached to the laser chip 505 by a solder 506 or electrically conductive epoxy. The solder 506 may interface with a conductive trace 531 which carries the conductive path to a portion of the interposer 530 that overhangs the laser chip 505. The conductive trace 531 may connect to the interconnects 515 to provide a path back to the package substrate 501. The conductive path to the top surface of the laser chip 505 may be the cathode (i.e., ground) connection for the laser chip 505. In an embodiment, an underfill 517 may be provided around the interconnects 515 and the bumps 507.

Figure 5D:
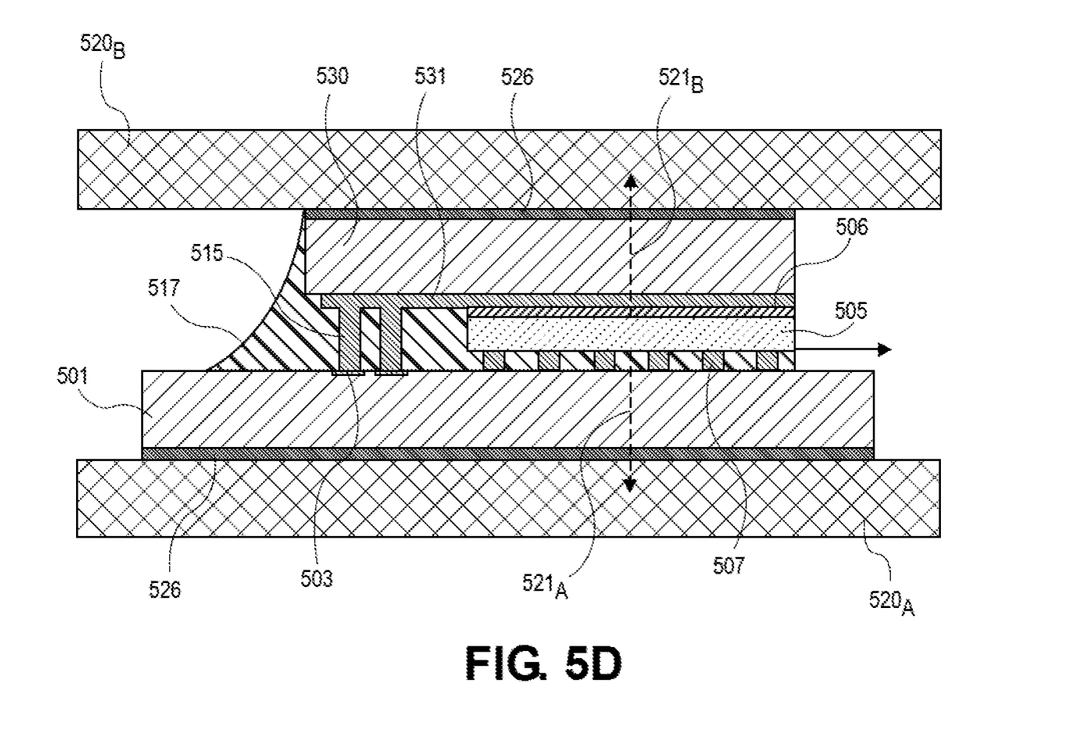
FIG. 5D is a cross-sectional illustration of the electronic device after cooling solutions are provided over the package substrate and the interposer, in accordance with an embodiment.

Referring now to FIG. 5D, a cross-sectional illustration of the package substrate 501 after a first cooling solution 520$_A$ and a second cooling solution 520$_B$ are attached is shown, in accordance with an embodiment. In an embodiment, the first cooling solution 520$_A$ is thermally coupled to the package substrate 501. For example, a TIM 526 may be provided between the first cooling solution 520$_A$ and the package substrate 501. In an embodiment, the second cooling solution 520$_B$ is thermally coupled to the interposer 530. For example, a TIM 526 may be provided between the second cooling solution 520$_B$ and the interposer 530. The first cooling solution 520$_A$ provides a cooling path 521$_A$ from the bottom surface of the laser chip 505, and the second cooling solution 520$_B$ provides a cooling path 521$_B$ from the top surface of the laser chip 505.

In an embodiment, the first cooling solution 520$_A$ and the second cooling solution 520$_B$ may be substantially similar to each other. In other embodiments, the first cooling solution 520$_A$ may be different than the second cooling solution 520$_B$. Since a dual sided cooling solution is provided, the efficiency of the cooling solutions 520$_A$ and 520$_B$ may be lower than the efficiency needed when a single sided cooling solution (e.g., similar to FIG. 1) is used. As such, the first cooling solution 520$_A$ and the second cooling solution 520$_B$ may comprise air cooled heatsinks. For example, the first cooling solution 520$_A$ and the second cooling solution 520$_B$ may comprise fins (not shown) that are cooled with air through convection. However, it is to be appreciated that the first cooling solution 520$_A$ and the second cooling solution 520$_B$ may comprise any type of cooling solution, such as, but not limited to, liquid cooled solutions, TEC solutions, vapor chambers, and the like.

Figure 6:
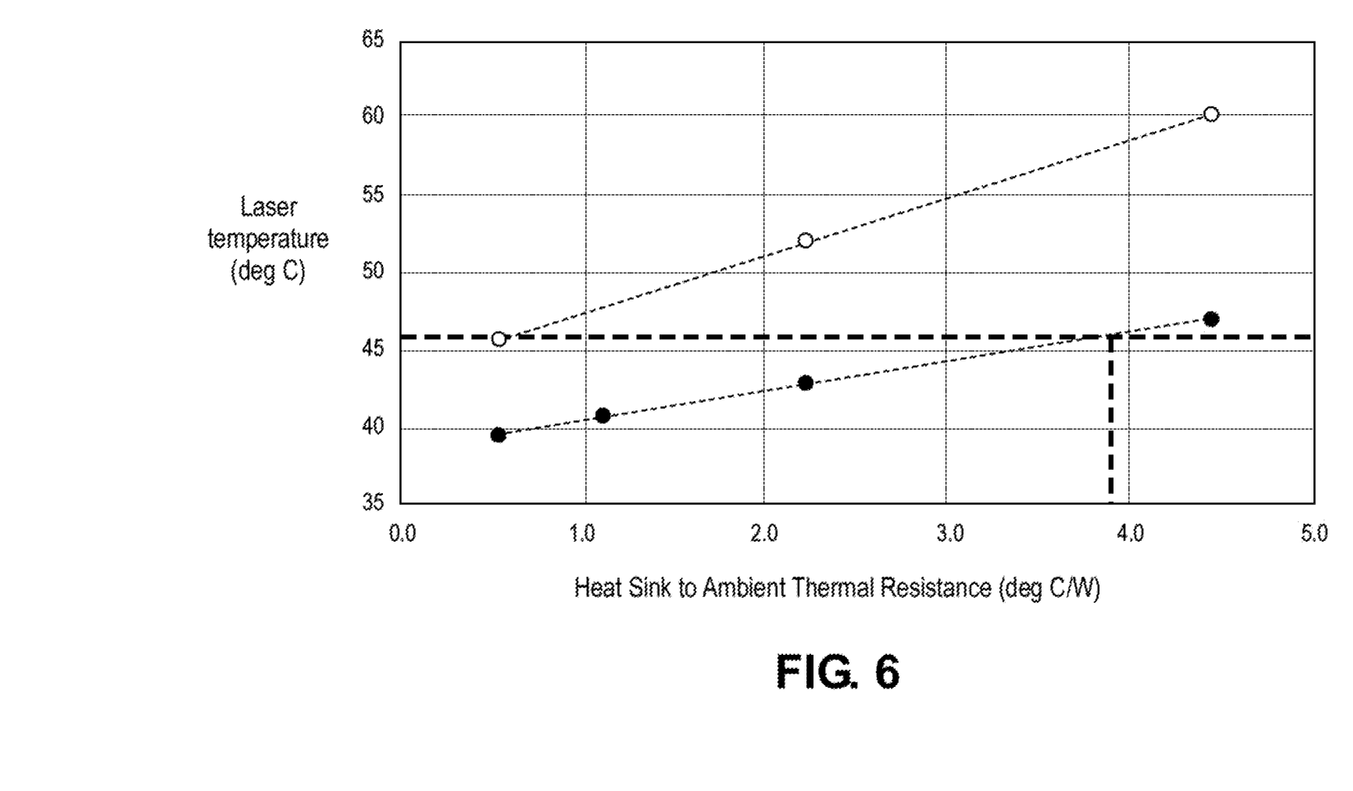
FIG. 6 is a graph of thermal resistance of a cooling solution and the laser temperature for a single sided cooling architecture and a dual sided cooling architecture.

Referring now to FIG. 6, a graph of thermal resistance versus laser temperature is shown, in accordance with an embodiment. The top line represents a laser package with a single sided cooling solution, and the bottom line represents a laser package with a dual sided cooling solution similar to one or more embodiments disclosed herein. As shown, for a given temperature, the dual sided cooling solution has a significantly higher thermal resistance. This represents that a less efficient cooling solution, when used in a dual sided architecture, is capable of providing the same cooling effect as a highly efficient cooling solution in a single sided architecture. Additionally, for a given cooling efficiency, the dual sided cooling solutions provide a lower laser temperature. As such, embodiments disclosed herein allow for reduced laser temperatures and/or effective cooling with less complex cooling solutions, such as air cooled cooling solutions.

Figure 7:
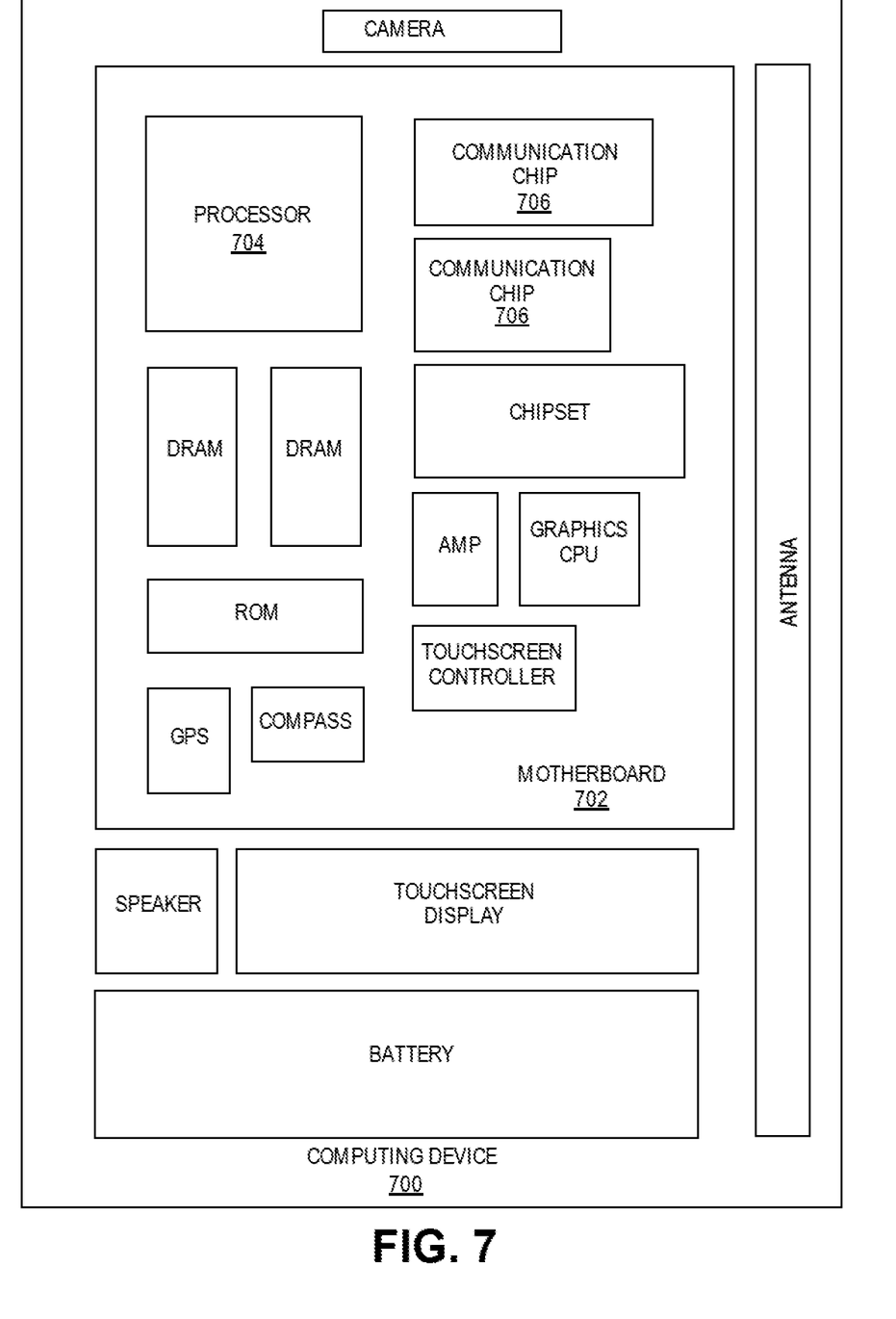
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be coupled to a laser package that comprises dual sided cooling solutions, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be coupled to a laser package that comprises dual sided cooling solutions, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a laser chip attached to the package substrate, wherein the laser chip has a first surface and a second surface opposite from the first surface; an interposer over the laser chip, wherein the interposer overhangs an edge of the laser chip; and an interconnect between the interposer and the package substrate.

Example 2: the electronic package of Example 1, wherein the interposer is a thermally conductive material.

Example 3: the electronic package of Example 2, wherein the interposer comprises AlN, SiC, or Si.

Example 4: the electronic package of Examples 1-3, wherein the first surface of the laser chip faces the interposer.

Example 5: the electronic package of Example 4, further comprising: conductive bumps between the first surface of the laser chip and the interposer.

Example 6: the electronic package of Example 4, further comprising: solder balls between the first surface of the laser chip and the interposer.

Example 7: the electronic package of Examples 4-6, wherein the first surface of the laser chip is electrically coupled to the interconnect by a trace on the interposer.

Example 8: the electronic package of Examples 4-7, wherein the second surface of the laser chip is electrically coupled to the package substrate by a solder or an electrically conductive epoxy.

Example 9: the electronic package of Examples 1-3, wherein the first surface of the laser chip faces the package substrate.

Example 10: the electronic package of Example 9, wherein the first surface of the laser chip is electrically connected to the package substrate by bumps or solder.

Example 11: the electronic package of Example 9 or Example 10, wherein the second surface of the laser chip is electrically connected to a trace on the interposer by a solder or an electrically conductive epoxy, and wherein the trace is electrically connected to the interconnect.

Example 12: the electronic package of Examples 1-11, further comprising: a first cooling solution on a surface of the package substrate facing away from the laser chip; and a second cooling solution on a surface of the interposer facing away from the laser chip.

Example 13: the electronic package of Example 12, wherein the first cooling solution and the second cooling solution comprise, an air cooled heatsink, a liquid cooled heatsink, or a thermoelectric cooler (TEC).

Example 14: the electronic package, comprising: a package substrate; a laser chip over the package substrate, wherein the laser chip comprises a first surface and a second surface; an interposer over the laser chip, wherein the interposer overhangs an edge of the laser chip; an interconnect between the interposer and the package substrate, wherein the interconnect is adjacent to the laser chip; a first cooling solution over a surface of the package substrate opposite from the laser chip; and a second cooling solution over a surface of the interposer opposite from the laser chip.

Example 15: the electronic package of Example 14, wherein a power connection is provided to the first surface of the laser chip along an electrical path comprising: the interconnect; a trace over the interposer; and a bump or solder ball between the interposer and the first surface of the laser chip.

Example 16: the electronic package of Example 15, wherein a ground connection is provided to the second surface of the laser chip along an electrical path comprising: a solder or an electrically conductive epoxy between the second surface of the laser chip and the package substrate.

Example 17: the electronic package of Example 14, wherein a power connection is provided to the first surface of the laser chip along an electrical path comprising: a bump or solder ball between the package substrate and the first surface of the laser chip.

Example 18: electronic package of Example 17, wherein a ground connection is provided to the second surface of the laser chip along an electrical path comprising: the interconnect; a trace on the interposer; and a solder or an electrically conductive epoxy between the second surface of the laser chip and the interposer.

Example 19: the electronic package of Examples 14-18, wherein the interconnect is a copper pillar.

Example 20: the electronic package of Examples 14-19, wherein the first cooling solution and the second cooling solution comprise, an air cooled heatsink, a liquid cooled heatsink, or a thermoelectric cooler (TEC).

Example 21: the electronic package of Examples 14-20, wherein the interposer is a thermally conductive material.

Example 22: the electronic package of Example 21, wherein the interposer comprises AlN, SiC, or Si.

Example 23: an electronic package, comprising: a package substrate; a laser chip attached to the package substrate, wherein the laser chip comprises: a first surface facing away from the package substrate; and a second surface facing the package substrate; an interposer over the laser chip; and an electrical path from the package substrate to the first surface of the laser chip, wherein the electrical path does not pass through the laser chip, and wherein the electrical path comprises: an interconnect between the package substrate and the interposer; a trace on the interposer; and a bump or solder ball between the interposer and the first surface of the laser chip.

Example 24: the electronic package of Example 23, further comprising: a first cooling solution over a surface of the package substrate facing away from the laser chip; and a second cooling solution over a surface of the interposer facing away from the laser chip.

Example 25: the electronic package of Example 24, wherein the first cooling solution and the second cooling solution comprise, an air cooled heatsink, a liquid cooled heatsink, or a thermoelectric cooler (TEC).

What is claimed is:

1. An electronic package, comprising:
   a package substrate;
   a laser chip attached to the package substrate, wherein the laser chip has a first surface and a second surface opposite from the first surface, wherein the laser chip has a first sidewall and a second sidewall between the first surface and the second surface, the first sidewall laterally opposite the second sidewall, and wherein the first sidewall is a light-emitting side of the laser chip;
   an interposer over the laser chip, wherein the interposer overhangs the second sidewall of the laser chip; and
   an interconnect between the interposer and the package substrate, the interconnect laterally spaced apart from the second sidewall of the laser chip.

2. The electronic package of claim 1, wherein the interposer is a thermally conductive material.

3. The electronic package of claim 2, wherein the interposer comprises AlN, SiC, or Si.

4. The electronic package of claim 1, wherein the first surface of the laser chip faces the interposer.

5. The electronic package of claim 4, further comprising: conductive bumps between the first surface of the laser chip and the interposer.

6. The electronic package of claim 4, further comprising: solder balls between the first surface of the laser chip and the interposer.

7. The electronic package of claim 4, wherein the first surface of the laser chip is electrically coupled to the interconnect by a trace on the interposer.

8. The electronic package of claim 4, wherein the second surface of the laser chip is electrically coupled to the package substrate by a solder or an electrically conductive epoxy.

9. The electronic package of claim 1, wherein the first surface of the laser chip faces the package substrate.

10. The electronic package of claim 9, wherein the first surface of the laser chip is electrically connected to the package substrate by bumps or solder.

11. The electronic package of claim 9, wherein the second surface of the laser chip is electrically connected to a trace on the interposer by a solder or an electrically conductive epoxy, and wherein the trace is electrically connected to the interconnect.

12. The electronic package of claim 1, further comprising:
    a first cooling solution on a surface of the package substrate facing away from the laser chip; and
    a second cooling solution on a surface of the interposer facing away from the laser chip.

13. The electronic package of claim 12, wherein the first cooling solution and the second cooling solution comprise, an air cooled heatsink, a liquid cooled heatsink, or a thermoelectric cooler (TEC).

14. An electronic package, comprising:
    a package substrate;
    a laser chip over the package substrate, wherein the laser chip comprises a first surface and a second surface, wherein the laser chip has a first sidewall and a second sidewall between the first surface and the second surface, the first sidewall laterally opposite the second sidewall, and wherein the first sidewall is a light-emitting side of the laser chip;
    an interposer over the laser chip, wherein the interposer overhangs the second sidewall of the laser chip;
    an interconnect between the interposer and the package substrate, wherein the interconnect is laterally spaced apart from the second sidewall of the laser chip;
    a first cooling solution over a surface of the package substrate opposite from the laser chip; and
    a second cooling solution over a surface of the interposer opposite from the laser chip.

15. The electronic package of claim 14, wherein a power connection is provided to the first surface of the laser chip along an electrical path comprising:
    the interconnect;
    a trace over the interposer; and
    a bump or solder ball between the interposer and the first surface of the laser chip.

16. The electronic package of claim 15, wherein a ground connection is provided to the second surface of the laser chip along an electrical path comprising:
    a solder or an electrically conductive epoxy between the second surface of the laser chip and the package substrate.

17. The electronic package of claim 14, wherein a power connection is provided to the first surface of the laser chip along an electrical path comprising:
    a bump or solder ball between the package substrate and the first surface of the laser chip.

18. The electronic package of claim 17, wherein a ground connection is provided to the second surface of the laser chip along an electrical path comprising:
    the interconnect;
    a trace on the interposer; and
    a solder or an electrically conductive epoxy between the second surface of the laser chip and the interposer.

19. The electronic package of claim 14, wherein the interconnect is a copper pillar.

20. The electronic package of claim 14, wherein the first cooling solution and the second cooling solution comprise, an air cooled heatsink, a liquid cooled heatsink, or a thermoelectric cooler (TEC).

21. The electronic package of claim 14, wherein the interposer is a thermally conductive material.

22. The electronic package of claim 21, wherein the interposer comprises AlN, SiC, or Si.

23. An electronic package, comprising:
 a package substrate;
 a laser chip attached to the package substrate, wherein the laser chip comprises:
  a first surface facing away from the package substrate;
  a second surface facing the package substrate; and
  a first sidewall and a second sidewall between the first surface and the second surface, the first sidewall laterally opposite the second sidewall, and wherein the first sidewall is a light-emitting side of the laser chip
 an interposer over the laser chip, wherein the interposer overhangs the second sidewall of the laser chip; and
 an electrical path from the package substrate to the first surface of the laser chip, wherein the electrical path does not pass through the laser chip, and wherein the electrical path comprises:
  an interconnect between the package substrate and the interposer, the interconnect laterally spaced apart from the second sidewall of the laser chip;
  a trace on the interposer; and
  a bump or solder ball between the interposer and the first surface of the laser chip.

24. The electronic package of claim 23, further comprising:
 a first cooling solution over a surface of the package substrate facing away from the laser chip; and
 a second cooling solution over a surface of the interposer facing away from the laser chip.

25. The electronic package of claim 24, wherein the first cooling solution and the second cooling solution comprise, an air cooled heatsink, a liquid cooled heatsink, or a thermoelectric cooler (TEC).

* * * * *